(12) United States Patent
Fangman

(10) Patent No.: US 8,466,400 B2
(45) Date of Patent: Jun. 18, 2013

(54) CALIBRATION SYSTEM FOR SOLAR COLLECTOR INSTALLATION

(75) Inventor: Michael E. Fangman, Reading, PA (US)

(73) Assignee: CEWA Technologies, Inc., Wyomissing, PA (US)

( * ) Notice: Subject to any disclaimer, the term of this patent is extended or adjusted under 35 U.S.C. 154(b) by 376 days.

(21) Appl. No.: 12/841,360

(22) Filed: Jul. 22, 2010

(65) Prior Publication Data

US 2011/0017903 A1 Jan. 27, 2011

Related U.S. Application Data

(60) Provisional application No. 61/228,440, filed on Jul. 24, 2009.

(51) Int. Cl.
*G01J 1/20* (2006.01)
(52) U.S. Cl.
USPC ......... 250/203.4; 136/244; 136/246; 136/291
(58) Field of Classification Search
USPC .................. 250/203.4; 136/246, 244, 291
See application file for complete search history.

(56) References Cited

U.S. PATENT DOCUMENTS

| | | | |
|---|---|---|---|
| 3,861,379 A | 1/1975 | Anderson et al. | |
| 4,146,785 A | 3/1979 | Neale | |
| 4,215,410 A | 7/1980 | Weslow et al. | |
| 4,314,546 A | 2/1982 | Miller | |
| 4,425,905 A | 1/1984 | Mori | |
| 4,548,195 A | 10/1985 | Balhorn | |
| 5,919,314 A | 7/1999 | Kim | |
| 6,680,693 B2 | 1/2004 | Urban et al. | |
| 6,688,303 B2 | 2/2004 | Davenport et al. | |
| 6,704,607 B2 | 3/2004 | Stone et al. | |
| 6,959,993 B2 | 11/2005 | Gross et al. | |
| 6,988,809 B2 | 1/2006 | Rabinowitz | |
| 7,109,461 B2 | 9/2006 | Lasich | |
| 7,432,488 B1 | 10/2008 | Hines et al. | |
| 7,501,572 B1 | 3/2009 | Rabinowitz | |
| 2008/0029151 A1 | 2/2008 | McGlynn et al. | |
| 2008/0236568 A1 | 10/2008 | Hickerson et al. | |
| 2009/0050191 A1 | 2/2009 | Young et al. | |
| 2009/0095342 A1 | 4/2009 | Lin et al. | |
| 2010/0000519 A1 | 1/2010 | Zalusky et al. | |
| 2010/0059042 A1 | 3/2010 | Chang et al. | |

*Primary Examiner* — Tony Ko
(74) *Attorney, Agent, or Firm* — Dickinson Wright PLLC

(57) ABSTRACT

A solar concentrator calibration tool that compensates for inconsistencies in the fabrication, assembly and installation of a solar collector system, permitting the solar collector to perform optimally. The calibration tool provides feedback information to a supervisory control processor, allowing the processor to compare the expected position of the sun to the "actual" position found by the calibration tool. The processor then generates a calibration signal, thereafter used by the collector's movement control mechanism, to compensate the tracking of the solar collector to accurately follow the movement of the sun, unconstrained by the effects of the construction inconsistencies.

20 Claims, 3 Drawing Sheets

CALIBRATION SYSTEM FOR SOLAR COLLECTOR INSTALLATION

CROSS-REFERENCE TO RELATED APPLICATION

The application claims the benefit of U.S. Provisional Application No. 61/228,440, filed Jul. 24, 2009 and herein incorporated by reference.

TECHNICAL FIELD

The present invention relates to the installation of a solar collector and, more particularly, to a system for providing alignment between the sun and the collector, regardless of the physical characteristics of the solar collector support system.

BACKGROUND OF THE INVENTION

In the increasingly important field of renewable energy production, solar power is a highly promising technology. In some cases, this technology employs solar cells, also known as photovoltaic (PV) cells, to convert solar radiation into direct current electricity. Solar cells may be arranged into arrays of flat panels, in which sunlight directly impinges upon large surface areas of solar cells. Or, solar cells may be used in photovoltaic concentrators, in which mirrors and lenses reflect and focus solar energy onto a much smaller solar cell. In other cases, solar irradiance is concentrated and focused onto a cavity receiver to produce thermal energy. While the efficiency of any solar power system is largely quantified by the ability of the concentrator to convert solar energy into electricity, the ability of the solar energy system to track the sun's movements also has a large effect on a solar power system's efficiency. That is, it remains an important consideration in solar energy systems to be able to effectively and efficiently adjust the angle of the solar panel/collector to maximize the intensity of the sunlight being collected.

One type of tracking system utilizes pedestal-mounted designs, in which a solar module is generally mounted on a vertical pole, or pedestal, which is itself inserted into the ground. Various mechanical linkages and motors are then used to tilt the panel on the support pole in one or two axes according to the sun's movements.

In addition to pedestal-mounted designs, many other tracking systems have utilized combinations of sliding rails, pin joints, ball-and-sockets, rotating wheels, and more. These non-pedestal designs involve multiple supports, typically located around the perimeter of the solar module, to anchor and control the module's movement. For instance, one prior art arrangement comprises a circular, ring-mounted reflector which is supported by a pair of diametrically-opposing levers, with a third lever located below and mid-way between the connections of the lever pair. The three levers use an assembly of linkages to turn the reflector to its desired position, which can include turning the reflector face-down to a protective stowed position.

While numerous tracking systems have been designed and implemented, problems remain with site preparation, "stack-up" tolerances as a result of the solar collector fabrication and assembly, as well as with the installation of the collector itself at the site. That is, solar collectors require the construction of a precise foundation and subsequent optical alignment in order to accurately align the collector with the sun during installation and thereafter track the sun's motion across the sky. The high costs associated with site preparation and fabrication of such a foundation impacts the economic viability of installing large-area solar collector fields (that is, an installation of a large number of separate collectors which are then operated as a "system").

SUMMARY OF THE INVENTION

The need remaining in the prior art is addressed by the present invention, which relates to the installation of a solar collector and, more particularly, to a calibration tool and procedure for creating "custom" tracking information that compensates for inaccuracies in an individual solar collector installation, thus maintaining alignment between the sun and the installed solar collector, regardless of various imperfections in the solar collector construction and installation.

In particular, the calibration tool of the present invention comprises a system that is removably attached to a solar collector system upon installation. The tool performs a calibration function by: (1) collecting a body of data defining the locations of a collector as it initially moves to track the sun's movement; (2) comparing this actual movement data with "expected" movement data (taken from standard solar charts and latitude/longitude information); (3) creating an adjustment "overlay" (in the form of the "difference" between these two sets of data); and (4) storing the overlay information within the collector's movement control mechanism.

The calibration tool comprises an alignment element (removably attached to the collector) used to sense the optimum alignment between the collector and the sun at any given point in time, a position encoder (also attached to the collector) to generate the collector's elevation and latitude information (in general, "position information") at any given point in time, and a processor that collects and utilizes the information from both the alignment element and the position encoder, in conjunction with the "expected" sun movement information, to determine the offset between the actual and expected values and thereby generate the calibration information (offset data) used by the servomechanisms to control the movement of the collector.

In operation, the calibration tool functions to initially provide alignment between the sun and the collector and determine the initial position information (e.g., elevation and azimuth) of the collector. Thereafter, a calibration routine (stored in the processor) is followed for a period of time sufficient to determine the offset between the expected location of the sun (relative to the optical axis of the collector—from known reference sources) and the actual location of the sun (relative to the optical axis of the collector—from the position encoder data). The offset information is used by the processor to determine the calibration adjustment that will be required to be performed by the collector's servomechanisms to keep that particular collector in alignment with the sun's path. The information is then transferred to the servomechanisms and the calibration tool is removed from the collector.

It is an advantage of the arrangement of the present invention that the calibration tool is only required upon initial installation of a solar collector. Once the calibration is performed, the tool may be removed and is ready for use with another collector installation.

Moreover, the use of a calibration tool to perfect the alignment between the sun and the collector has been found to reduce the accuracy required in preparing the installation site, constructing the individual components of the system and building the system in the field. These reductions yield a significant cost savings over prior art arrangements that relied on precise alignment upon installation.

Other and further aspects and embodiments of the present invention will become apparent during the course of the following discussion and by reference to the accompanying drawings.

BRIEF DESCRIPTION OF THE DRAWINGS

Referring now to the drawings.

DETAILED DESCRIPTION

Figure 1:
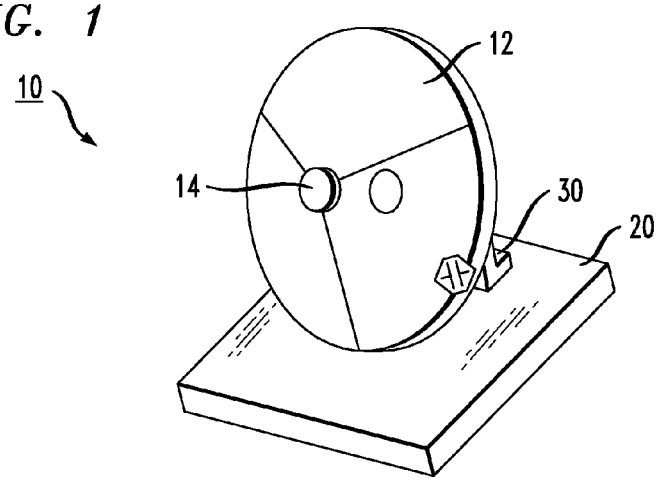
FIG. 1 illustrates an exemplary solar collector that may utilize the calibration tool of the present invention.
Figure 2:
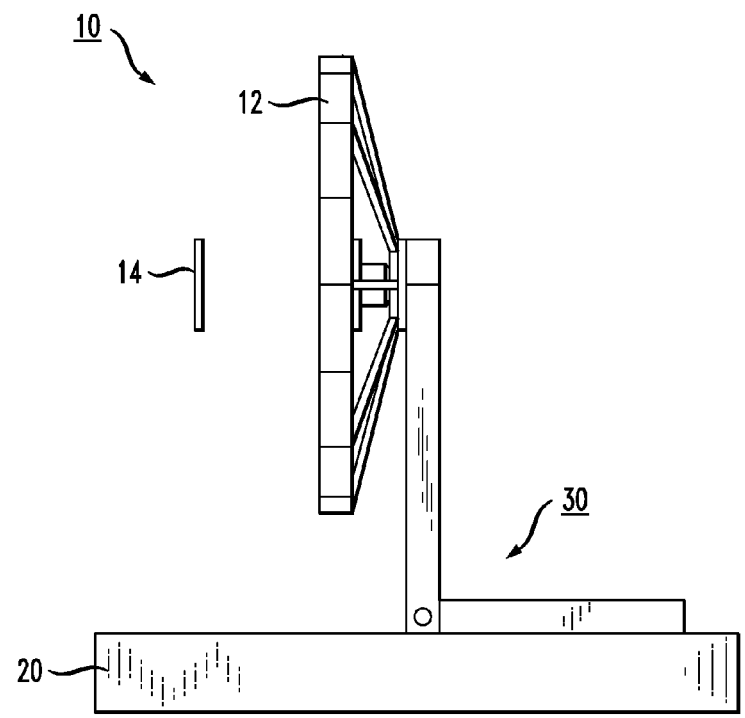
FIG. 2 is a side view of the collector of FIG. 1.

FIG. 1 is a simple illustration of an exemplary solar collector 10 that can be calibrated with the system of the present invention to provide a tracking program that overcomes imperfections that may exist in the system components, installation site preparation and/or on-site construction of the solar collector itself. In this particular example, solar collector 10 includes a concentrating reflector 12 for re-directing impinging solar radiation onto a receiver 14 (or a secondary reflector positioned at that location). At an installation site, collector 10 may be attached to, for example, a concrete pad 20, or similar support structure. A mounting structure 30 is used to attach collector 10 to pad 20. Although not explicitly shown in this view, structure 30 also includes servomechanisms used to move collector 10 so as to track the sun's movement during the course of the day. A side view of the arrangement of FIG. 1 is shown in FIG. 2, which illustrates a particular configuration of mounting structure 30. As discussed above, the variations in site preparation and concentrator assembly will impact the alignment between collector 10 and the sun. For example, a "level" platform upon which to mount a collector should not exhibit an offset from "level" no greater than "millimeters" over a platform several meters in width. Variations in the dimensions of mounting structure 30 may also impact the alignment between collector 10 and the sun.

Figure 3:
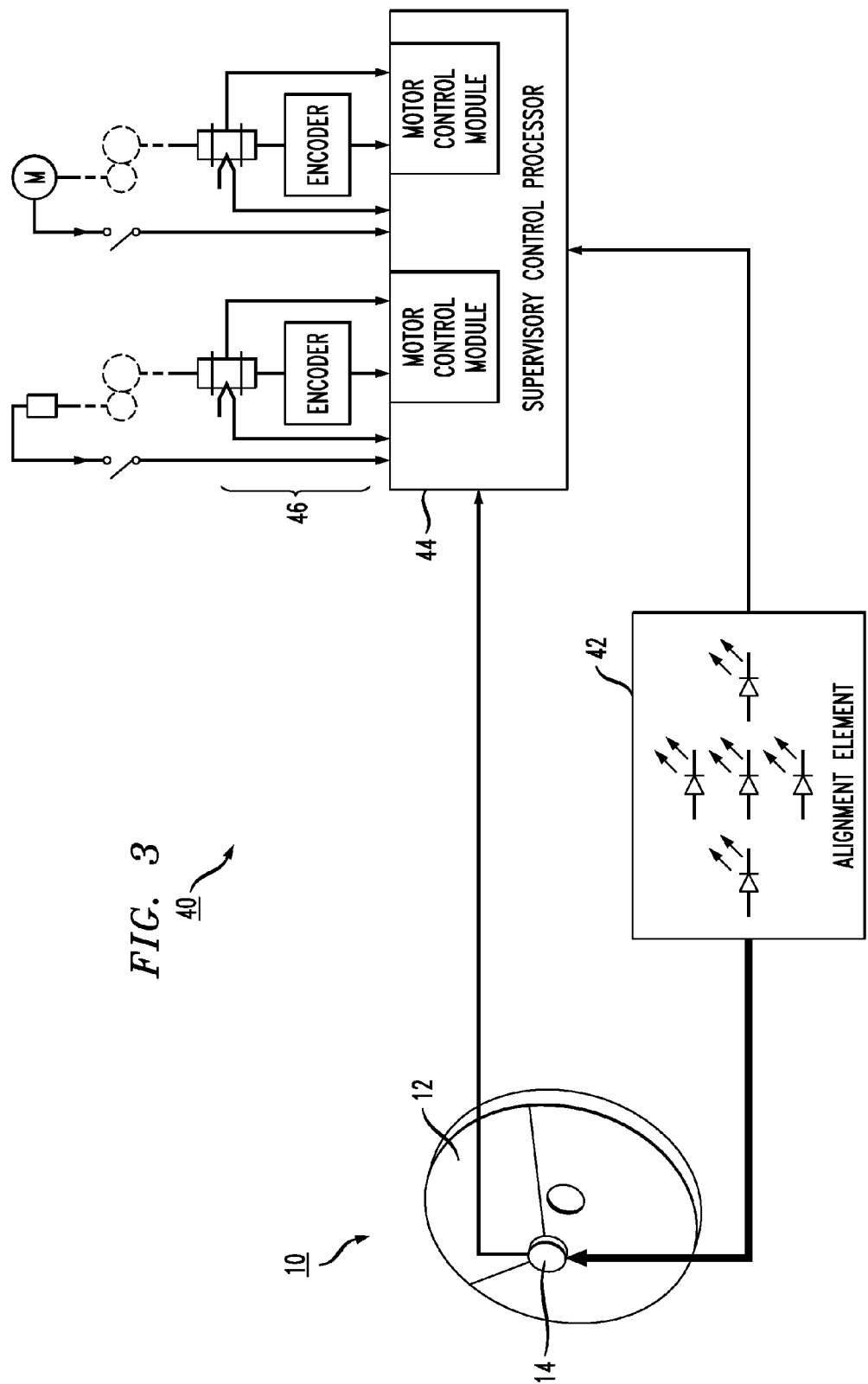
FIG. 3 is a diagram of an exemplary calibration tool formed in accordance with the present invention.

FIG. 3 illustrates an exemplary calibration tool 40 formed in accordance with the present invention to provide for a correction between the expected path of the sun's movements and the "actual" locations of the sun observed by receiver 14 as collector 10 moves to maintain alignment. As discussed above, the difference between the expected and actual values can be attributed to a variety of factors including, but not limited to, imperfections in the pad upon which the collector is installed, misalignment between system components, imperfections in the construction of the individual system components and/or construction imperfections in the actual installation of the solar collector system in the field. Calibration tool 40 is not permanently attached to solar collector 10, but is only used upon installation to determine the offset between the predicted and actual values and create an adjustment signal thereafter used by the collector's servomechanisms to control the movement of collector 10. Thereafter, calibration tool 40 is removed.

As shown in FIG. 3, calibration tool 40 includes an alignment element 42, a processor 44 and a position encoder 46. Alignment element 42 is used to periodically re-adjust the position of collector 10 to maintain the collector's optical axis in alignment with the location of the sun. In one embodiment, alignment element 42 comprises a quadrant photodiode sensor array that will create a series of electrical output signals based upon the amount of solar radiation received by the array. Various other types of arrangements may be used to form alignment element 42 including, but not limited to, a matrix configuration of photodiodes, a set of thermocouples, a camera; in general, any type of instrumentation that will be affected by radiation from the sun.

Processor 44 includes a control program that will cause the collector to adjust its position until alignment between the sun and alignment element 42 is achieved (i.e., when "maximum" solar radiance is measured by, for example, a photodiode array). Once alignment is achieved, the actual location information associated with the position of collector 10 (in terms of elevation and azimuth data) are recorded by position encoder 46 and transmitted to processor 44.

With this understanding of the operation of the elements forming calibration tool 40, an exemplary calibration process as performed in accordance with the present invention will now be described in detail.

Figure 4:
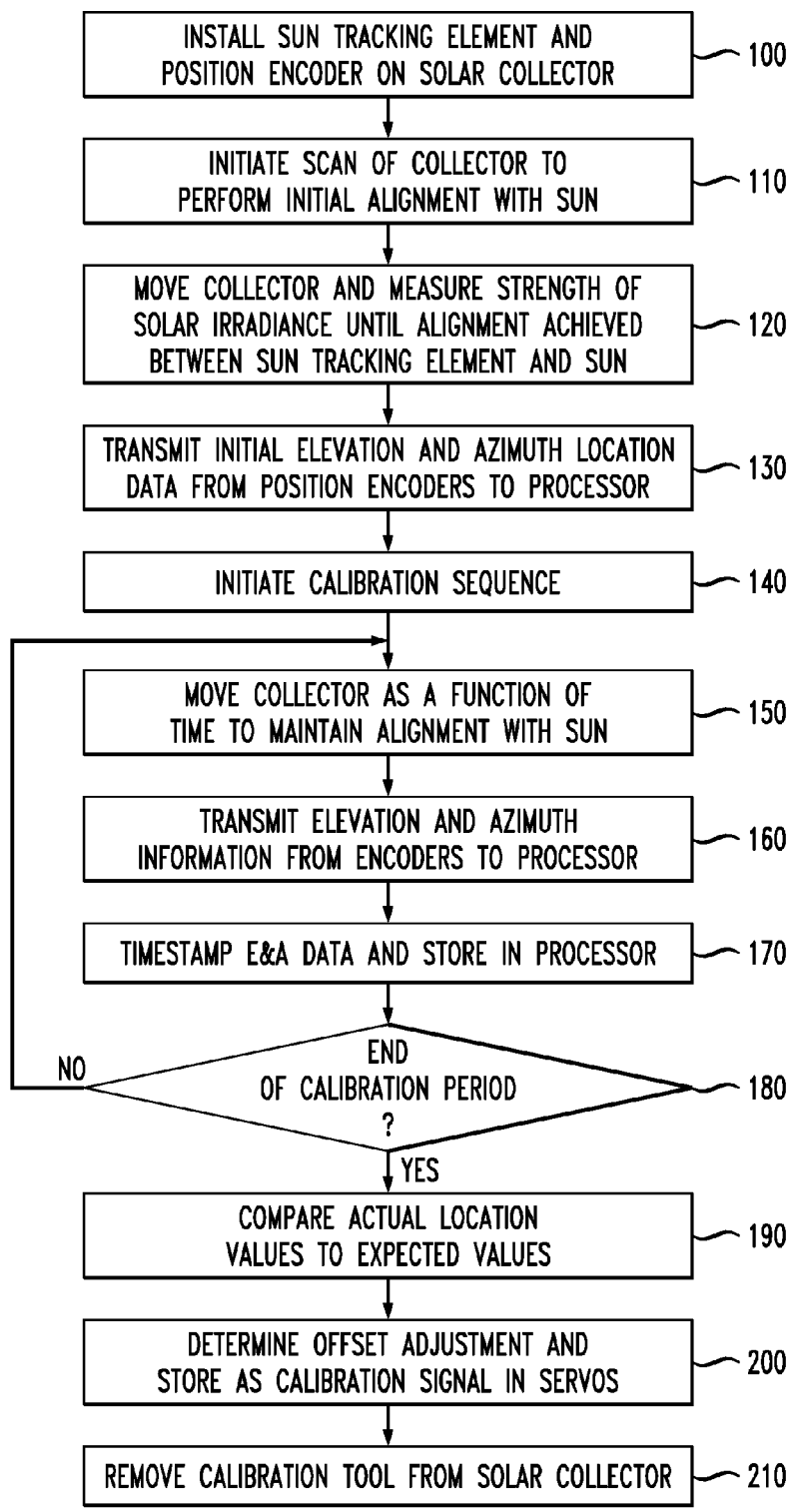
FIG. 4 is a flowchart illustrating an exemplary process of performing solar collector calibration in accordance with the present invention.

FIG. 4 contains a flowchart of an exemplary process that can be used to implement the calibration process as provided in accordance with the present invention. The process begins at step 100 with the attachment of alignment element 42 and position encoder 46 to the solar collector system. In order to properly calibrate the alignment of the collector system with the location of the sun, alignment element 42 needs to be positioned along the optical axis of the system. In a preferred embodiment, alignment element 42 is positioned at receiver 14, allowing for its relatively straightforward attachment and later removal.

Once these elements are in place, the calibration process starts with an initial scan movement of collector 10 (step 110) and measurement of the optical signal (sun's radiance) impinging alignment element 42. This step can be thought of as a "centering" process to initially line up receiver 14 of the solar collector system with the position of the sun. As shown in step 120, the movement of collector 10 (under the control of the servomechanisms included in mounting structure 30) continues, with the power of the optical signal captured by alignment element 42 being transmitted to processor 44 until a signal associated with optimum alignment is achieved (e.g., maximum solar power is measured). At this point, an initial registration of collector 10 with the sun's location has been accomplished, and the location of collector 10 (elevation and azimuth) is transmitted from position encoders 46 to processor 44 (step 130).

Inasmuch as the sun continuously traverses a path across the horizon, collector 10 must remain aligned with the sun's position to continue to receive maximum radiance. The art is replete with systems that provide such tracking, as mentioned above. However, these systems are known to utilize only the 'predicted' or 'expected' movement of the sun (for a given geographic location, time of year, etc.) and do not take into account any irregularities introduced into the tracking by the imperfections in the solar collector system itself. It is the purpose of the present invention to understand these irregularities and calibrate the "path" followed by the collector so as to remain in alignment with the actual location of the sun.

Thus, the calibration process of the present invention continues at step 140 with the initiation of the calibration sequence. The sequence begins with the movement of collector 10 continuing to be controlled, for a predetermined period of time, by measuring the optical signal received by alignment element 42 so as to maintain alignment with the sun (step 150). As each movement is performed, the solar collector's location information from position encoders 46 (e.g., elevation and azimuth) is transmitted to processor 44 (step 160), which appends a timestamp to this location data and stores it in an included memory module (step 170).

At this point, a decision is made (step 180) to determine if the calibration time period has expired. Presuming the calibration period has not expired, the process returns to step 150, where the position of the collector is again re-aligned with the sun (using feedback from alignment element 42) and the associated elevation and azimuth information is transmitted to processor 44.

By repeating these steps for a predetermined period of time (measured in, perhaps, hours or minutes), a body of data is created that defines the actual position of the sun with respect to collector 10 that is required to maintain alignment therebetween. Once a sufficient amount of data has been gathered (as determined by the individual performing the calibration), the process moves on to step 190, where processor 44 functions to compare the collected actual data regarding the elevation and azimuth of the sun to the expected values associated with the geographic information stored therein.

Inasmuch as any installed solar collector will have one or more imperfections, the actual and predicted values will be different. Processor 44 then functions to determine this difference as an offset adjustment that needs to be made to the expected values of the sun's movements (associated with the movement over the course of an entire year) and transmits this offset adjustment as a calibration signal to the servomechanisms associated with mounting structure 30 (step 200). Once the calibration information has been stored in the servomechanisms, the calibration process is finished, and alignment element 42 and position encoder 46 are removed from the solar collector system (step 210).

It is to be understood that calibration tool 40 may be extended to control a network of solar concentrators that have been co-located in a distributed fashion across an 'open field' area. In conventional arrangements, such concentrator arrays have to compromise between land usage and shadowing of neighboring concentrators. Solar thermal collection is conducted only when the sun is 30 degrees off the horizon, resulting in an average of 6.25 hours/day of solar collection over the year. The control/tracking method of the present invention can be configured to raise the dishes in sequence as the sun breaks the horizon without shadowing. This would result in a 4% increase in annual capacity factor.

While the invention has been described with reference to the preferred embodiments, obvious modifications and alterations are possible by those skilled in the relevant art. Therefore, it is intended that the invention include all such modifications and alterations to the full extent that they come within the scope of the following claims or equivalents thereof.

What is claimed is:

1. A calibration tool for aligning a solar collector system with a sun, the calibration tool comprising:
   an alignment element removably attached along an optical axis of the solar collector system wherein the alignment element is configured to provide information regarding a current alignment between the sun and the solar collector system;
   a position encoder attached to the solar collector system and configured to generate information regarding a location of the solar collector system upon alignment with the sun; and
   a processor coupled to both the alignment element and the position encoder, wherein the processor is configured to utilize the information regarding the location of the solar collector system in conjunction with information regarding expected movements of the sun and expected movements of the solar collector system to determine a difference between the location of the solar collector system and the expected movements of the solar collector system, and wherein the difference is used as a calibration adjustment for a movement control mechanism of the solar collector system.

2. The calibration tool as defined in claim 1, wherein the alignment element comprises a photodiode sensor array.

3. The calibration tool as defined in claim 2, wherein the photodiode sensor array comprises a quadrant sensor array.

4. The calibration tool as defined in claim 1, wherein the position encoder is configured to generate elevation and azimuth data as part of the information regarding the location of the solar collector system.

5. The calibration tool as defined in claim 1, wherein:
   the alignment element and the position encoder are removably attached to the solar collector system.

6. The calibration tool as defined in claim 1, wherein:
   the processor is further configured to communicate the calibration adjustment to the movement control mechanism of the solar collector system.

7. A method of calibrating movements of a solar collector to track movements of a sun, the method comprising:
   initially aligning the solar collector with the sun;
   performing a tracking operation for a predetermined period of time, and recording first location data for the solar collector for each movement of the solar collector during the tracking operation;
   comparing the first location data recorded during the tracking operation with expected location information based upon a known path of the sun;
   determining an offset in position of the solar collector between the first location data and the expected location information; and
   transmitting the offset in the position of the solar collector as a calibration signal to one or more servomechanisms used to control movements of the solar collector with respect to the sun.

8. The method as defined in claim 7, wherein:
   performing the tracking operation comprises:
   using a calibration tool to perform the tracking operation for the predetermined period of time; and
   recording the first location data for the solar collector for each movement of the solar collector during the tracking operation.

9. The method as defined in claim 8, further comprising: after performing the tracking operation, removing the calibration tool from the solar collector.

10. The method as defined in claim 8, further comprising: before performing the tracking operation, removably coupling the calibration tool to the solar collector.

11. The method as defined in claim 9, further comprising after removing the calibration tool from the solar collector, recoupling the calibration tool to the solar collector;
   performing a second tracking operation for a second predetermined period of time using the calibration tool;
   recording second location data for the solar collector for each movement of the solar collector during the second tracking operation;
   comparing the second location data recorded during the second tracking operation with the expected location information based upon the known path of the sun;
   determining a second offset in the position of the solar collector between the second location data and the expected location information;

transmitting the second offset in the position of the solar collector as a second calibration signal to the one or more servomechanisms;

uncoupling the calibration tool from the solar collector; and after uncoupling the calibration tool, moving the solar collector using the one or more servomechanisms based upon the second calibration signal.

12. The method as defined in claim 9, further comprising:

after removing the calibration tool from the solar collector, coupling the calibration tool to a second solar collector;

performing a second tracking operation for a second predetermined period of time for the second solar collector using the calibration tool;

recording second location data for the second solar collector for each movement of the second solar collector during the second tracking operation;

comparing the second location data recorded during the second tracking operation with second expected location information based upon the known path of the sun;

determining a second offset in a position of the second solar collector between the second location data and the second expected location information;

transmitting the second offset in the position of the second solar collector as a second calibration signal to one or more second servomechanisms of the second solar collector;

uncoupling the calibration tool from the second solar collector; and after uncoupling the calibration tool from the second solar collector, moving the second solar collector using the one or more second servomechanisms based upon the second calibration signal.

13. The method as defined in claim 7, further comprising:

after removing the calibration tool and after transmitting the offset, moving the solar collector using the one or more servomechanisms based upon the calibration signal.

14. A method of tracking a sun using a solar collector system, the solar collector system comprises a solar collector configured to collect solar radiation from the sun and a movement mechanism configured to move the solar collector, the method comprising:

determining calibration movement data of the solar collector using a solar calibration mechanism, wherein the calibration movement data comprises data regarding movements of the solar collector relative to movements of the sun at each of two or more first points in time;

using a computer processor to compare the calibration movement data to predetermined correct movement data to determine offset data, wherein the predetermined correct movement data comprises one or more positions of the solar collector that substantially maximizes solar energy received by the solar collector at each of the two or more first points in time; and using the computer processor to determine correction data for the movements of the solar collector for two or more second points in time based upon the offset data, wherein the correction data is to be used by the movement mechanism to more accurately align the movements of the solar collector with the movements of the sun.

15. The method of claim 14, further comprising:

before determining the calibration movement data of the solar collector, removably coupling the solar calibration mechanism to the solar collector system.

16. the method of claim 15, further comprising:

initially aligning the solar collector with the sun, wherein:

removably coupling the solar calibration mechanism to the solar collector system occurs after initially aligning the solar collector with the sun.

17. The method of claim 14, further comprising:

after determining the calibration movement data of the solar collector, uncoupling the solar calibration mechanism from the solar collector system.

18. The method of claim 14, further comprising:

using the correction data to align the movements of the solar collector with the movements of the sun.

19. The method of claim 14, wherein:

a second solar collector system comprises a second solar collector configured to collect solar radiation from the sun and a second movement mechanism configured to move the second solar collector, the method further comprising:

determining second calibration movement data of the second solar collector using the solar calibration mechanism, wherein the second calibration movement data comprises second data regarding movements of the second solar collector relative to movements of the sun at each of two or more third points in time;

using the computer processor to compare the second calibration movement data to second predetermined correct movement data to determine second offset data, wherein the second predetermined correct movement data comprises one or more positions of the second solar collector that substantially maximizes solar energy received by the second solar collector at each of the two or more third points in time; and using the computer processor to determine second correction data for the movements of the second solar collector for two or more fourth points in time based upon the second offset data, wherein the second correction data is to be used by the second movement mechanism to more accurately align the movements of the second solar collector with the movements of the sun.

20. The method of claim 19, further comprising:

before determining the second calibration movement data, removably coupling the solar calibration mechanism to the second solar collector system;

after determining the second calibration movement data, uncoupling the solar calibration mechanism from the second solar collector system; and using the second correction data to align the movements of the second solar collector with the movements of the sun.

* * * * *